US006617062B2

(12) United States Patent
Chang (10) Patent No.: US 6,617,062 B2
(45) Date of Patent: Sep. 9, 2003

(54) STRAIN-RELIEVED TUNABLE DIELECTRIC THIN FILMS (75) Inventor: Wontae Chang, Reston, VA (US)

(73) Assignee: Paratek Microwave, Inc., Columbia, MD (US)

( * ) Notice: Subject to any disclaimer, the term of this patent is extended or adjusted under 35 U.S.C. 154(b) by 0 days.

(21) Appl. No.: 09/834,327

(22) Filed: Apr. 13, 2001

(65) Prior Publication Data

US 2003/0022030 A1 Jan. 30, 2003

(51) Int. Cl.[7] .................................................. B32B 9/00
(52) U.S. Cl. ....................... 428/701; 428/697; 428/699; 428/702
(58) Field of Search ................................ 428/697, 699, 428/701, 702; 501/137

(56) References Cited

U.S. PATENT DOCUMENTS

| 5,312,790 | A |   | 5/1994  | Sengupta et al. |         |
|-----------|---|---|---------|-----------------|---------|
| 5,427,988 | A |   | 6/1995  | Sengupta et al. |         |
| 5,593,495 | A |   | 1/1997  | Masuda et al.   |         |
| 5,635,433 | A |   | 6/1997  | Sengupta et al. |         |
| 5,635,434 | A |   | 6/1997  | Sengupta et al. |         |
| 5,640,042 | A |   | 6/1997  | Koscica et al.  |         |
| 5,693,429 | A |   | 12/1997 | Sengupta et al. |         |
| 5,694,134 | A |   | 12/1997 | Barnes          |         |
| 5,753,945 | A | * | 5/1998  | Chivukula et al.| 257/295 |
| 5,766,697 | A |   | 6/1998  | Sengupta et al. |         |
| 5,830,591 | A |   | 11/1998 | Sengupta et al. |         |
| 5,846,893 | A |   | 12/1998 | Sengupta et al. |         |
| 5,886,867 | A |   | 3/1999  | Chivukula et al.|         |
| 5,990,766 | A |   | 11/1999 | Zhang et al.    |         |
| 6,001,420 | A | * | 12/1999 | Mosely et al.   | 427/258 |
| 6,025,619 | A | * | 2/2000  | Azuma et al.    | 257/295 |
| 6,074,971 | A |   | 6/2000  | Chiu et al.     |         |
| 6,078,717 | A | * | 6/2000  | Nashimoto et al.| 2/131   |
| 6,096,127 | A | * | 8/2000  | Dimos et al.    | 117/9   |
| 6,312,816 | B1| * | 11/2001 | Roeder et al.   | 252/62.9 PZ |
| 6,410,941 | B1| * | 6/2002  | Taylor et al.   | 257/441 |

OTHER PUBLICATIONS

Chang et al., "Dielectric Properties of (Ba,Sr)TiO$_3$ Thin Films for Tunable Microwave Applications", *Integrated Ferroelectrics*, 1999, pp. 257–272, vol. 24, No. 1, No Month.

Chang et al., "Microstructural Architecture of (Ba,Sr)TiO$_3$ Thin Films for Tunable Microwave Applications", *Mat. Res. Soc. Symp. Proc.*, Nov. 30, 1999, pp. 181–186, vol. 603.

Chang et al., Influence of Strain on Microwave Dielectric Properties of (Ba,Sr)TiO$_3$ Thin Films, *J. of Appl. Phys.*, 2000, pp. 3044–3049, vol. 87. No Month.

Kim et al., "Microwave Properties of Tetragonally Distorted Ba$_{0.5}$Sr$_{0.5}$TiO$_3$ Thin Films", *Appl. Phys. Lett.*, 2000, pp. 1185–1187, vol. 76, No Month.

Chang et al., "The Effect of Annealing on the Microwave Properties of Ba$_{0.5}$Sr$_{0.5}$TiO$_3$ Thin Films", *Appl. Phys. Lett.*, pp. 1033–1035 vol. 74, No Month.

PCT International Search Report for International Application No. PCT/US02/11361 dated Oct. 8, 2002.

* cited by examiner

*Primary Examiner*—Deborah Jones
*Assistant Examiner*—A B Sperty
(74) *Attorney, Agent, or Firm*—Alan G. Towner; William J. Tucker (57) ABSTRACT

Tunable dielectric thin films are provided which possess low dielectric losses at microwave frequencies relative to conventional dielectric thin films. The thin films include a low dielectric loss substrate, a buffer layer, and a crystalline dielectric film. Barium strontium titanate may be used as the buffer layer and the crystalline dielectric film. The buffer layer provides strain relief during annealing operations.

40 Claims, 8 Drawing Sheets

STRAIN-RELIEVED TUNABLE DIELECTRIC THIN FILMS

FIELD OF THE INVENTION

The present invention relates to tunable dielectric thin films, and more particularly relates to strain-relieved and defect-reduced tunable dielectric thin films which significantly reduce dielectric loss at microwave frequencies.

BACKGROUND INFORMATION

Considerations in the development of tunable microwave devices based on ferroelectric materials are the dielectric constant, tunability and the dielectric quality factor (Q=1/tan $\delta$) of the materials. The DC electric field dependent dielectric constant of ferroelectric thin films, such as $Ba_{1-x}Sr_xTiO_3$ (BST, $0 \leq x \leq 1$), is currently being used to develop low loss tunable microwave devices, such as voltage-controlled oscillators, tunable filters and phase shifters. This results from disadvantages associated with currently available tunable microwave devices based on PIN diodes and ferrites. Current semiconductor-based devices exhibit substantial losses at frequencies over 2 GHz, and high power is needed to operate current ferrite-based devices.

The provision of low loss tunable microwave devices based on ferroelectric thin films would reduce the size and operating power of devices while providing wide bandwidth and narrow beamwidth. One of the most critical properties that should be maximized in these applications is the dielectric quality factor of the ferroelectric thin films while maintaining a reasonable change in the dielectric constant with low DC electric fields at high frequencies (i.e., $\geq 2$ GHz).

Although attempts have been made at developing tunable dielectric thin films having low dielectric losses, and improvements have been made at low frequencies ($\leq 1$ MHz), prior art methods are not conducive to the use of these films in tunable applications at high frequencies (i.e., $\geq 2$ GHz). Tunable dielectric materials having significantly increased Q values at low frequencies ($\leq 1$ MHz) developed in the prior art are not commercially viable because currently available semiconductor materials have much better performance at those frequencies than the conventionally developed dielectric materials. A dielectric thin film ferroelectric device with optimal characteristics for tunable microwave applications has not yet been provided in the prior art.

SUMMARY OF THE INVENTION

The present invention provides dielectric thin films for applications such as electronically tunable devices having tuning specified for each device (i.e., voltage-controlled oscillators, tunable filters, phase shifters, etc.) and a high quality factor at high frequencies ($\geq 2$ GHz). A strain-relieved tunable dielectric thin film is provided which minimizes a strain-enhanced inverse relationship between dielectric tuning and dielectric Q. The present invention provides strain-relieved and defect-reduced dielectric films that exhibit desirable dielectric properties at high frequencies (i.e., $\geq 2$ GHz), which can be used in applications such as tunable microwave devices. The present invention also provides for annealing of the film material without thermally induced unit cell distortion caused by film strain due to thermal expansion mismatch between the film and substrate.

A process in accordance with an embodiment of the present invention includes the steps of: (i) forming a thin (e.g., <1,000 Å) buffer layer such as BST (i.e., any porous phase between partially crystallized amorphous phase and fully crystallized randomly oriented phase) on a crystalline, low dielectric loss substrate by a low temperature deposition technique and a subsequent heat treatment; (ii) depositing a second layer (e.g., 5,000 Å) of highly crystallized randomly oriented BST film on top of the BST buffer layer at a high temperature (e.g., 750° C.); and (iii) annealing the film to reduce deposition-related crystalline defects (e.g., oxygen vacancies) and to grow crystalline grains.

In accordance with an embodiment of the present invention, the thin BST buffer layer relieves the film strain caused by film/substrate mismatches, i.e., lattice and thermal expansion mismatches between the film and substrate during the film deposition process and post-annealing process. The strain-relieved and defect-reduced tunable dielectric thin film according to the invention provides higher dielectric quality factors at high frequencies ($\geq 2$ GHz) than currently existing prior art semiconductor materials as well as other prior art ferroelectric materials. Thus, the present invention provides a tunable dielectric thin film for tunable microwave applications, and a method of formation thereof, which relieves film strain having a significant effect on both microstructure and microwave dielectric properties of the film.

An aspect of the present invention is to provide a tunable dielectric thin film comprising a low dielectric loss substrate, a buffer layer on the low dielectric loss substrate, and a crystalline dielectric film on the buffer layer.

Another aspect of the present invention is to provide a method of making a thin film dielectric material. The method comprises the steps of depositing a thin dielectric buffer layer on a low dielectric loss substrate at a first temperature, and depositing a layer of dielectric thin film on the dielectric buffer layer at a second temperature. The deposited layers may be annealed to reduce crystalline defects and to grow crystalline grains.

These and other aspects of the present invention will be more apparent from the following description.

DETAILED DESCRIPTION

The present invention provides a tunable dielectric thin film including: a low dielectric loss substrate; a buffer layer on the low dielectric loss substrate; and a crystalline dielectric film on the buffer layer. A process to relieve film strain in crystalline BST film is also provided which utilizes a thin BST buffer layer (i.e., any BST phase from amorphous to randomly oriented crystalline phase). Such strain-relieved films using this method may be heat-treated without thermally induced distortion which would otherwise result due to thermal expansion mismatch between the film and substrate, e.g., during annealing.

Figure 1A:
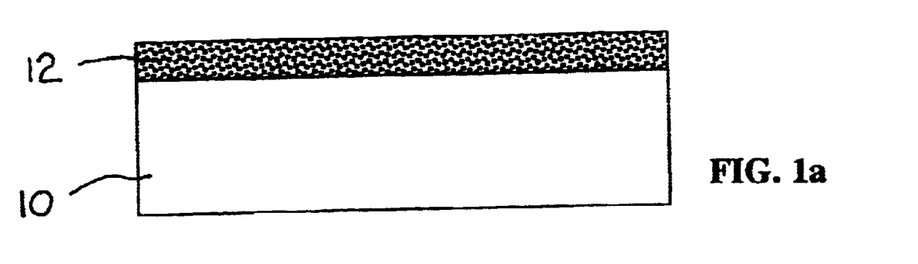
FIGS. 1a–1c schematically illustrate manufacturing process steps in accordance with an embodiment of the present invention.
Figure 1B:
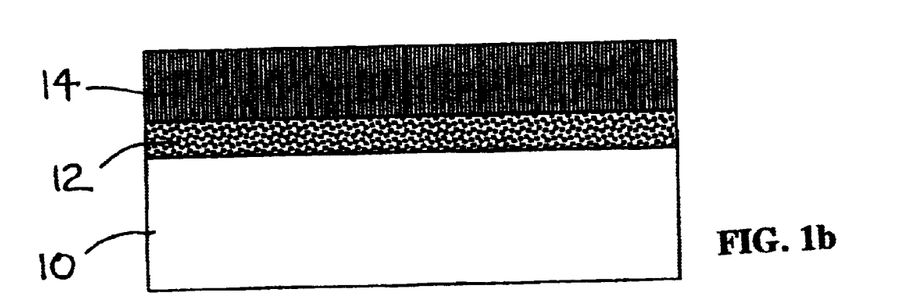
Figure 1C:
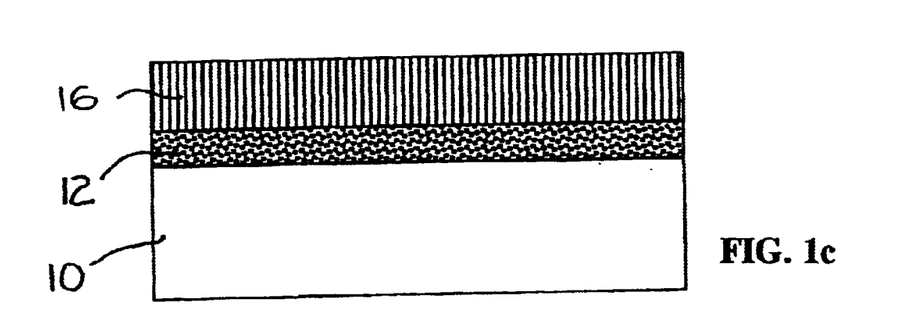

FIGS. 1a–1c schematically illustrate a manufacturing process of a dielectric thin film according to the present invention. In FIG. 1a, a buffer layer 12 is deposited on a low dielectric loss substrate 10. In FIG. 1b, a crystalline dielectric film 14 is deposited on the buffer layer 12. The buffer layer 12 and crystalline dielectric thin film 14 may be deposited by techniques such as RF sputtering, pulsed laser deposition, metal-organic chemical vapor deposition and the like. In FIG. 1c, the crystalline dielectric film 16 has been annealed. For example, the method illustrated in FIGS. 1a–1c may comprise the steps of BST buffer layer deposition, strain-relieved crystalline BST film deposition on top of BST buffer layer, and strain-relieved or substantially strain free and defect-reduced BST film preparation through annealing.

The low dielectric loss substrate 10 may have a thickness of, for example, from about 250 to about 500 micron or more, with thicknesses of about 500 micron being suitable for many applications. The buffer layer 12 may typically have a thickness of from about 0.0005 to about 0.2 micron, for example, from about 0.01 to about 0.05 or 0.1 micron. The crystalline dielectric film 16 may have a typical thickness of from about 0.1 to about 5 micron, for example, from about 0.3 to about 1 micron.

As a dielectric film is strained during film deposition processes and post-annealing processes due to thermal expansion mismatch between the film and substrate, conventional films do not have desirable dielectric properties exhibiting both high dielectric Q and high dielectric tuning because of the film strain, even though structural defects are significantly reduced and crystalline grains are largely grown in the film during the post-annealing. For example, U.S. Pat. No. 6,096,127 to Dimos et al. entitled "Tunable Dielectric Films having Low Electrical Losses" discloses that reduction in loss is realized by dramatically increasing the grain size of the dielectric films. The increase in grain size is realized by heating the film to a temperature at which the grains experience regrowth. However, after post-annealing, the Q value at 0 $V_{DC}$ of the epitaxial dielectric films grown on $LaAlO_3$ substrates are even lower ($Q_{0V}$=30) with higher dielectric tuning (64–69% at E=3–5 V/μm) at 1–2 GHz than the films without post-annealing (i.e., $Q_{0V}$= 40–50 with a 36–38% dielectric tuning). Apparently, the resulting dielectric properties result because, after post-annealing, the epitaxial films are strained further into an in-plane tetragonal distortion due to thermal expansion mismatch between the film and substrate, even though film grains are expected to grow during the post-annealing process.

It has been observed that epitaxially grown BST of the formula $Ba_{1-x}Sr_xTiO_3$ (where BST x=0.3–0.6) films on (100) MgO and $LaAlO_3$ substrates are tetragonally distorted at room temperature, although the structure for the corresponding bulk is cubic, and the lattice distortion has a significant impact on the microwave dielectric properties. Both experimental results based on planar capacitors incorporating epitaxial BST films deposited on (100) MgO and $LaAlO_3$ substrates and theoretical analyses for the experimental configuration (i.e., in-plane properties of the films) based on Devonshire thermodynamic theory show that the structural distortion caused by film strain is one of factors enhancing an inverse relationship between dielectric tuning and dielectric Q at microwave frequencies. The inverse relationship enhanced in epitaxial BST films results in either a large dielectric tuning (>75%) with a low dielectric Q (<50), or a high dielectric Q (>200) with a small dielectric tuning (<10%) with a reasonably small DC bias voltage (i.e., 50 V) and gap size (i.e., 5 μm) of a planar structure at microwave frequencies, depending on either in-plane tetragonal distortion or normal tetragonal distortion, respectively. Therefore, as long as a substantial strain-induced structural distortion exists in the film, the microwave dielectric properties of the film cannot exhibit both large dielectric tuning and high dielectric Q at the same time. Film strain should therefore be relieved to improve the dielectric properties.

The present invention provides a process for forming tunable dielectric thin films having high dielectric Q for use in tunable microwave applications through the formation of strain-relieved and defect-reduced tunable dielectric thin films. Preferred thin film dielectric materials include $Ba_{1-x}Sr_xTiO_3$ (where $0 \leq x \leq 1$) which is a solid-solution ferroelectric material exhibiting a DC electric field-dependent dielectric constant and a Ba/Sr composition-dependent Curie temperature. Preferred thin film dielectric materials for tunable microwave applications at room temperature have Ba/Sr compositions of x=0.4 (i.e., $Ba_{0.6}Sr_{0.4}TiO_3$) and x=0.5 (i.e., $Ba_{0.5}Sr_{0.5}TiO_3$). The barium strontium titanate materials may optionally include other materials, such as dopants and/or other metal oxides.

Other tunable dielectric materials may be used partially or entirely in place of barium strontium titanate. Examples include $Ba_xCa_{1-x}TiO_3$ ($0.2 \leq 0.8$), $Pb_xZr_{1-x}SrTiO_3$ ($0.05 \leq x \leq 0.4$), $KTa_xNb_{1-x}O_3$ ($0 \leq x \leq 1$), $Pb_xZr_{1-x}TiO_3$ ($0 \leq x \leq 1$), and mixtures and composites thereof. Also, these tunable dielectric materials can be combined with low loss dielectric materials, such as magnesium oxide (MgO), aluminum oxide ($Al_2O_3$) and zirconium oxide ($ZrO_2$) and/or with additional doping elements, such as manganese (Mn), iron (Fe), and tungsten (W) or other alkali earth metal oxide (i.e., calcium oxide, etc.), transition metal oxides (i.e., manganese oxide, iron oxide, hafnium oxide, tungsten oxide, etc.), rare earth metal oxides, silicates, niobates, tantalates, aluminates, zirconates, and titanates to further reduce the dielectric loss. The buffer layer may also be barium titanate, strontium titanate, barium calcium titanate, barium calcium zirconium titanate, lead titanate, lead zirconium titanate, lead lanthanum zirconium titanate, lead niobate, lead tantalate, potassium strontium niobate, sodium barium niobate/potassium phosphate, potassium niobate, lithium niobate, lithium tantalate, lanthanum tantalate, barium calcium zirconium titanate or sodium nitrate.

Suitable low dielectric loss substrates include magnesium oxide (MgO), aluminum oxide ($Al_2O_3$) and lanthanum aluminum oxide ($LaAl_2O_3$). Suitable buffer layers may be made of the same or similar compositions as the crystalline dielectric thin films deposited thereon. Examples include $Ba_{1-x}Sr_xTiO_3$ ($0 \leq x \leq 1$), $Ba_xCa_{1-x}TiO_3$ ($0.2 \leq x \leq 0.8$), $Pb_xZr_{1-x}SrTiO_3$ (0.05≦x≦0.4), $KTa_xNb_{1-x}O_3$ (0≦x≦1), $Pb_xZr_{1-x}TiO_3$ (0≦x≦1), and mixtures and composites thereof.

Two tests were conducted. Example 1 included tunable dielectric thin film deposition using pulsed laser deposition (PLD), film structure characterization using x-ray diffraction (XRD) and scanning electron microscopy (SEM), and post-deposition film annealing. Example 2 included single-gap planar electrodes preparation on top of the film using a photolithography lift off technique and dielectric property measurement (i.e., dielectric tuning and dielectric Q) at 2 and 8 GHz using gap-coupled microstrip resonators connected to an HP network analyzer.

EXAMPLE 1

A number of tunable dielectric thin films were fabricated to demonstrate the superior dielectric properties at microwave frequencies of the film according to the present invention over currently existing prior art semiconductor materials as well as other prior art ferroelectric materials. First, a thin (<0.1 µm thick) amorphous BST (x=0.4) buffer layer was deposited on (001) MgO low dielectric loss, single crystal substrate at room temperature in an oxygen background pressure of 200 mTorr by pulsed laser deposition (PLD). The output of a short-pulsed (30 ns full width at half maximum) eximer laser operating with KrF ($\lambda$=248 nm) at 1 Hz was focused to a spot size of ~0.1 cm² and an energy density of 1.9 J/cm² onto a single-phase BST (x=0.4) target. The vaporized material was deposited onto (001) MgO substrate approximately 5 cm away from the target. The microstructure of BST buffer layer can be modified into any phase between an almost amorphous phase and a randomly oriented fully crystallized phase, depending on heat treatment after the buffer layer deposition at room temperature.

Figure 2A:
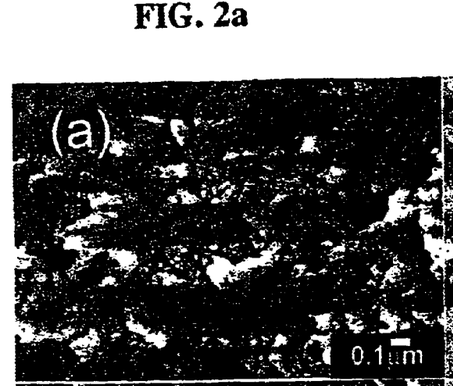
FIGS. 2a–2d are scanning electron microscope (SEM) images of a BST buffer layer, a BST dielectric film deposited on the BST buffer layer, and an annealed BST film.
Figure 2B:
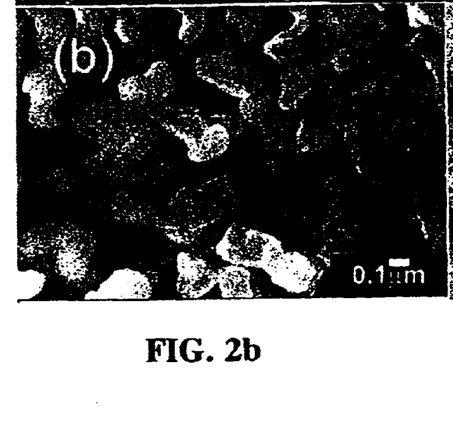
Figure 3A:
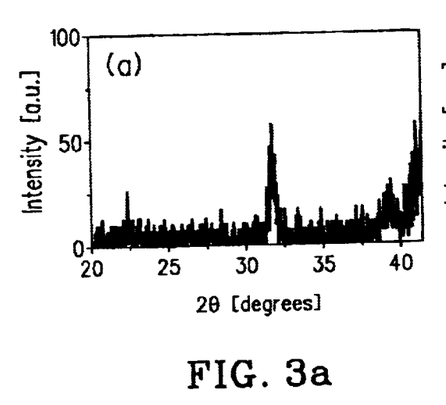
FIGS. 3a–3d are x-ray diffraction (XRD) patterns of the BST buffer layer of FIGS. 2a and 2b, respectively, the BST film of FIG. 2d, and the JCPDS card #34-0411 for $Ba_{0.6}Sr_{0.4}TiO_3$ powder.
Figure 3B:
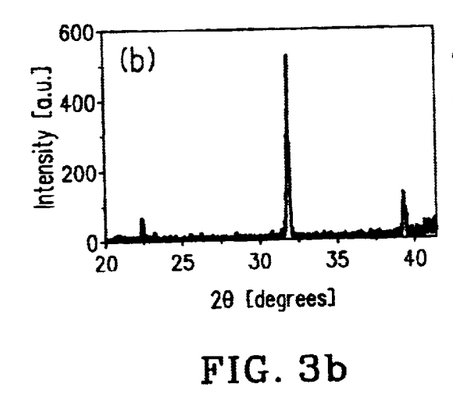

FIG. 2a and FIG. 3a show a SEM image and a XRD pattern, respectively, of a BST (x=0.4) buffer layer deposited at room temperature and then heated at 750° C. for 1 min in an oxygen background pressure of 200 mTorr. The microstructure turns out as an almost amorphous phase with an extremely small size of perovskite BST phase nucleation. On the other hand, FIG. 2b and FIG. 3b show a SEM image and a XRD pattern, respectively, of a BST (x=0.4) buffer layer deposited at room temperature and then annealed at 900° C. for 6 hours in an oxygen background pressure of 1 atmosphere. In this case, the microstructure turns out as a fully crystallized randomly oriented BST phase. However, both phases as shown in FIGS. 2a and 2b and FIGS. 3a and 3b have relatively large spaces (i.e., pores) between the grains. The randomly oriented grains in the BST buffer layer could serve as seeds for the subsequently deposited crystalline BST film. The random orientation of the grains and the spaces (i.e., pores) between the grains in the buffer layer could help not only relieving film strain but also growing crystalline grains in the subsequently deposited dielectric film.

Figure 2C:
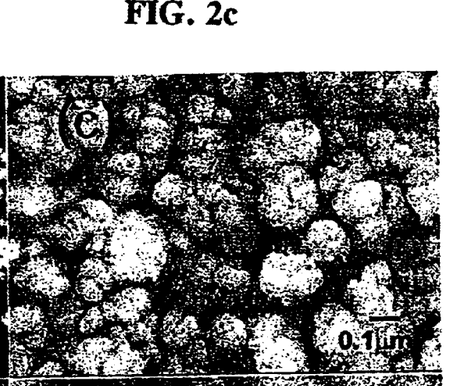

Next, as a part of the tunable dielectric film, a BST (x=0.4) thin film (0.3 µm thick) was deposited on top of the BST buffer layer. All deposition conditions including laser parameters were the same as in the BST buffer layer deposition step except a substrate temperature of 750° C. and a laser repetition rate of 5 Hz were used. FIG. 2c shows a SEM image of BST (x=0.4) film as deposited at 750° C. on BST buffer layer of FIG. 2b, indicating that the pores in the BST buffer layer are filled with an aggregation of small grains (≦0.1 µm) of subsequently deposited BST film.

Figure 2D:
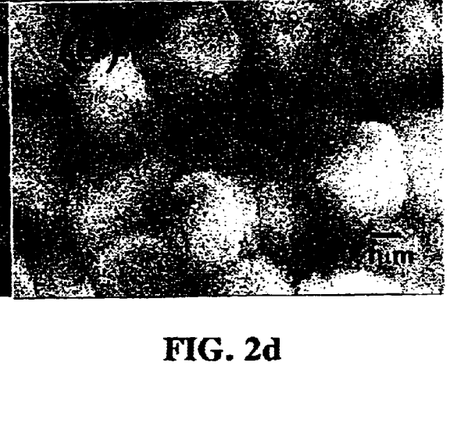
Figure 3C:
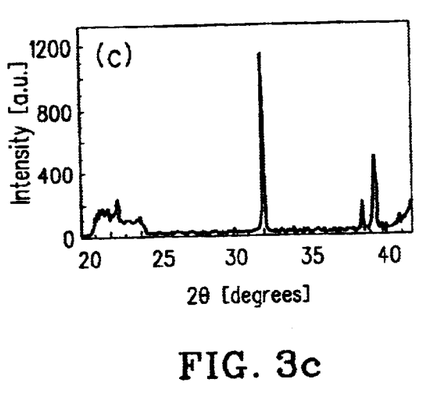
Figure 3D:
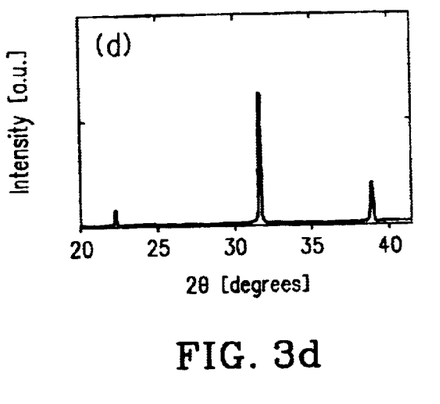

Next, the BST film deposited on the BST buffer layer was annealed in flowing oxygen at 1,000° C. for 6 hours. FIG. 2d and FIG. 3c show a SEM image and a XRD pattern, respectively, of the BST film annealed at 1,000° C. in flowing oxygen for 6 hours. The grain size is observed to grow significantly up to ~0.5 µm by reducing grain boundaries which existed in the as-deposited BST film during the post annealing process, as shown in FIGS. 2c and 2d. An analysis of the XRD pattern of FIG. 3c indicates that the annealed BST film deposited with the BST buffer layer is a single perovskite phase but not a single crystallographic orientation, which was the same as in an XRD pattern (not shown) for as-deposited BST film with BST buffer layer. Also, the ratio of peak intensities is very close to the corresponding powder diffraction pattern as shown in FIG. 3d, indicating that the BST film with BST buffer layer is a randomly oriented polycrystalline phase.

The lattice structure of the BST film with BST buffer layer was determined as a cubic phase ($a_o$=3.966 Å) based on XRD patterns of 11 reflection peaks (i.e., (100), (110), (111), (200), (210), (211), (220), (310), (311), (222), and (321) peaks) from the BST film. It is also noted that the lattice parameter (3.966 Å) of the BST (x=0.4) film with BST (x=0.4) buffer layer is very close to the equilibrium lattice parameter (3.965 Å) of bulk BST (x=0.4). These structural (i.e., microstructure and lattice structure) analyses indicate that film strain due to the film-substrate mismatches (i.e., lattice and thermal expansion) could be effectively avoided using the buffer layer during film deposition and post annealing processes. Advantageous annealing effects (i.e., reducing defects and growing grains) of the film material were achieved without thermally induced film strain due to film-substrate thermal expansion mismatch during post-deposition heat treatment.

In addition to the BST film deposition with the BST buffer layer according to the present invention, a BST (x=0.4) thin film (0.3 µm thick) was grown directly on a (001) MgO substrate without a BST (x=0.4) buffer layer at 750° C. in an oxygen background pressure of 200 mTorr by pulsed laser deposition. This is a typical BST film deposition method using pulsed laser deposition (PLD). This additional experiment demonstrates how film strain caused by the film-substrate mismatches (i.e., lattice and thermal expansion) without a BST buffer layer affects the microstructure, lattice structure, and microwave dielectric properties of the film.

Figure 4A:
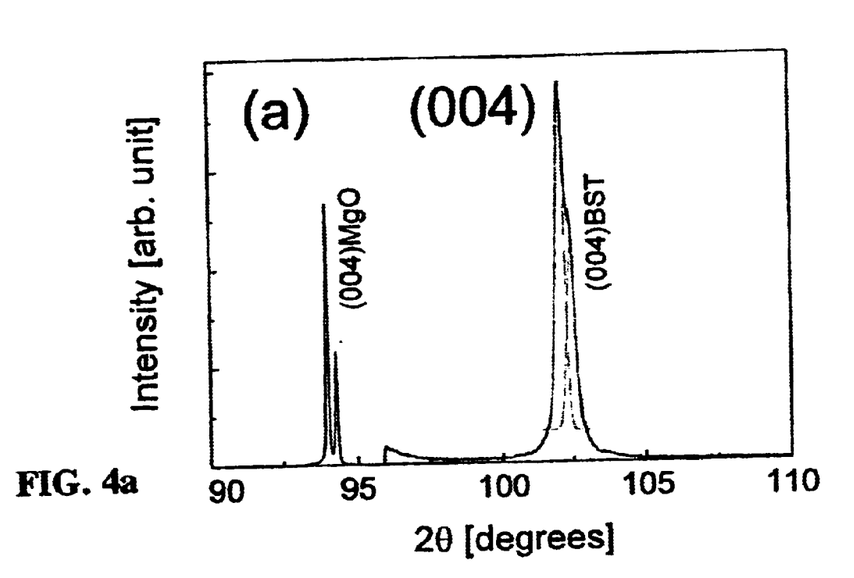
FIGS. 4a and 4b are x-ray diffraction (XRD) patterns of (a) symmetric (004) peaks and (b) asymmetric (024) peaks of epitaxial BST film deposited on (001) MgO without a BST buffer layer.
Figure 4B:
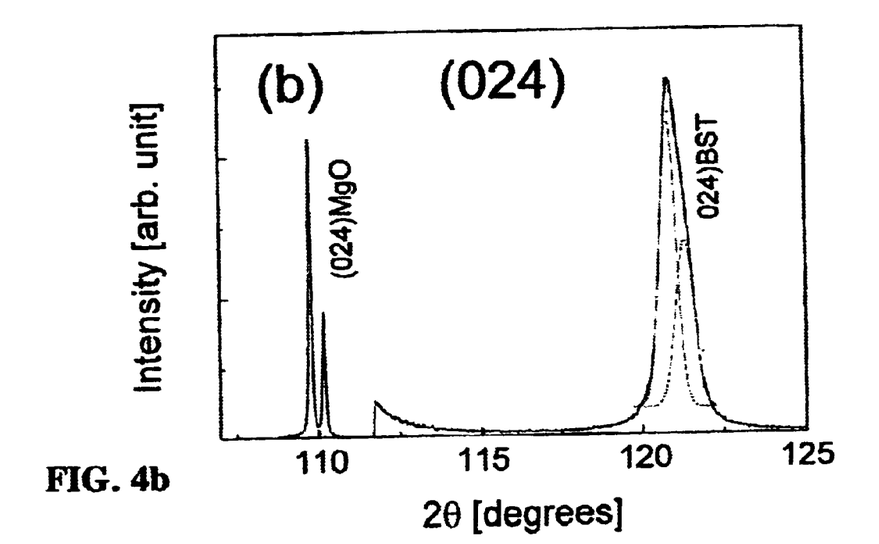

A BST (x=0.4) thin film deposited directly on a (001) MgO substrate without a BST (x=0.4) buffer layer was found by XRD to be single phase and exclusively oriented in the (001) direction (i.e., epitaxial film). FIGS. 4a and 4b show x-ray diffraction (XRD) patterns of symmetric (004) peaks and asymmetric (024) peaks, respectively, of the BST film annealed in flowing $O_2$ at 1,000° C. for 6 hours.

To determine the film strain (i.e., lattice structure), the lattice parameters along the surface normal ($a_{normal}$) and in the plane of the film ($a_{in-plane}$) were determined from XRD patterns of (004) and (024) reflections for (001) oriented epitaxial BST film deposited directly on (001) MgO substrate without a BST buffer layer as shown in FIGS. 4a and 4b, respectively. Diffraction from the MgO substrate was used as an internal standard to reduce errors associated with measurement. Each BST diffraction peak was fitted with two Gaussian functions by considering four factors of peak shape (i.e., ratios of height, width, and area of $K_{\alpha 1}$ and $K_{\alpha 2}$ peaks, and distance between $K_{\alpha 1}$ and $K_{\alpha 2}$ peaks) after removing the background. The uncertainty of the lattice parameter is typically less than 0.001 Å. The results of 2θ measurement and lattice parameter calculation in FIGS. 4a and 4b are presented in Table 1. Table 1 lists 2θ peak values of FIGS. 4a and 4b and the calculated lattice parameters (i.e., surface normal and in-plane) of epitaxial BST film deposited on (001) MgO without BST buffer layer.

TABLE 1

|  | MgO substrate | | BST (x = 0.4) film | |
|---|---|---|---|---|
| (hkl) | (004) | (024) | (004) | (024) |
| 2Θ [degree] | 93.9743 | 109.7669 | 102.0780 | 120.7885 |
| $a_{normal}$ [Å] | 4.2112 | | 3.962 | |
| $a_{in-plane}$ [Å] | 4.2112 | | 3.969 | |

The in-plane lattice parameter of epitaxial BST (x=0.4) film deposited directly on (001) MgO substrate without the BST (x=0.4) buffer layer is observed to be 0.2% larger than the normal lattice parameter, resulting in an in-plane tetragonal lattice distortion ($a_{in-plane}>a_{normal}$), although the structure for the corresponding bulk BST is a cubic structure.

EXAMPLE 2

Characterization of small signal microwave properties of a planar varactor containing a strain-relieved and defect-reduced BST (x=0.4) thin film with a BST (x=0.4) buffer layer according to the present invention was made at room temperature using a gap-coupled half-wavelength (λ/2) stripline resonator connected to an HP 8510C network analyzer.

Figure 5A:
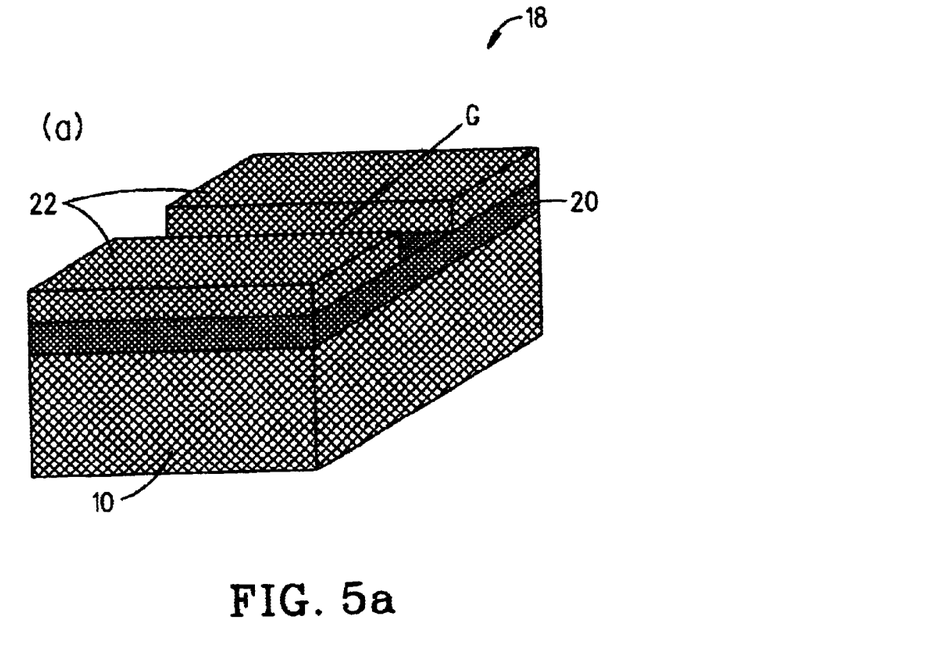
FIGS. 5a and 5b are partially schematic isometric views of tunable dielectric varactors based on (a) epitaxial BST film deposited on (001) MgO without a BST buffer layer, and (b) randomly oriented polycrystalline BST film deposited on (001)MgO with a BST buffer layer.
Figure 5B:
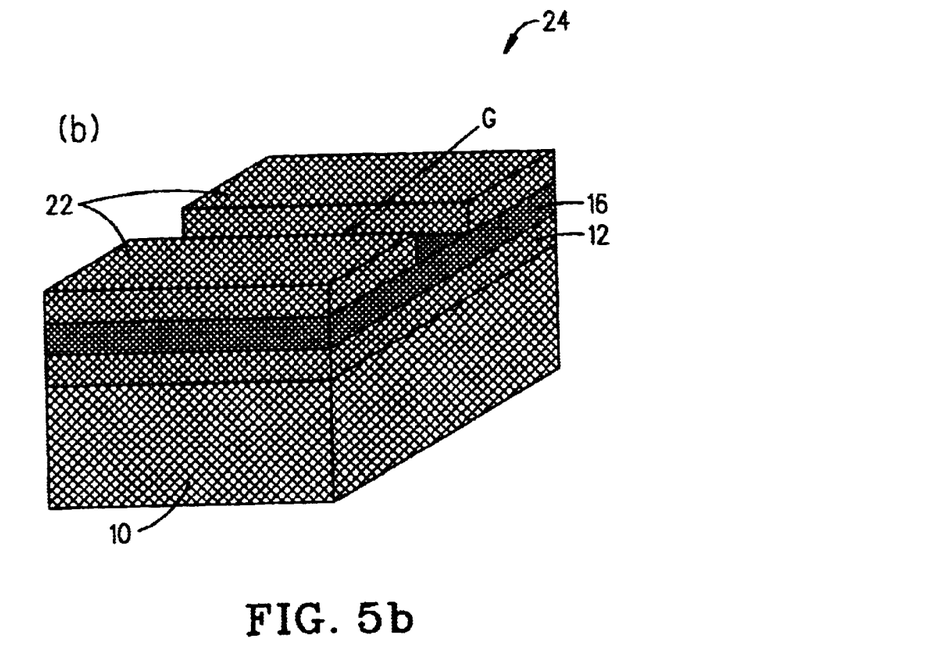

FIG. 5a illustrates a planar varactor 18 based on a strained but defect-reduced epitaxial BST (x=0.4) film 20 deposited directly on a (001) MgO substrate 10 without a BST (x=0.4) buffer layer, and then annealed in flowing oxygen at 1,000° C. for 6 hours. FIG. 5b illustrates a planar varactor 24 based on a strain-relieved and defect-reduced randomly oriented crystalline BST (x=0.4) film 16 deposited on a (001) MgO substrate 10 with a BST (x=0.4) buffer layer 12 in accordance with the present invention, and then annealed in flowing oxygen at 1,000° C. for 6 hours. For both types of varactor shown in FIGS. 5a and 5b, single-gap planar electrodes 22 with gaps G of from 6 to 18 μm are deposited on top of the BST (x=0.4) films through a photolithography lift-off technique by e-beam evaporation of 0.5 μm thick Au with a thin (300 Å thick) adhesion layer of Ti.

The determination of capacitance ($C_p$) and dielectric quality factor (Q=1/tan δ) of the planar varactor as a function of DC bias voltage was made at about 2 GHz and 8 GHz by including the varactor into a break of the resonator stripline and by measuring loaded Q ($Q_L$), insertion loss ($S_{21}$), 3 dB width (Δf) of resonant frequency, and resonant frequency ($f_r$). It is noted that dielectric Q measurements using a stripline resonator should be limited by unloaded Q ($Q_o$) of the resonator with varactor practically without dielectric loss (i.e., $Q_o$=300 and 500 for 2 GHz and 8 GHz resonators in this experiment, respectively). Dielectric tuning of capacitance (% T($C_p$)) can be defined as $\{[C_p(0\ V_{DC})-C_p(V_{DC})]/C_p(0\ V_{DC})\}\times100$. Dielectric constant of BST (x=0.4) film ($\epsilon_{film}$) was extracted from capacitance ($C_p$) value and varactor dimension by conformal mapping transformation.

Figure 6A:
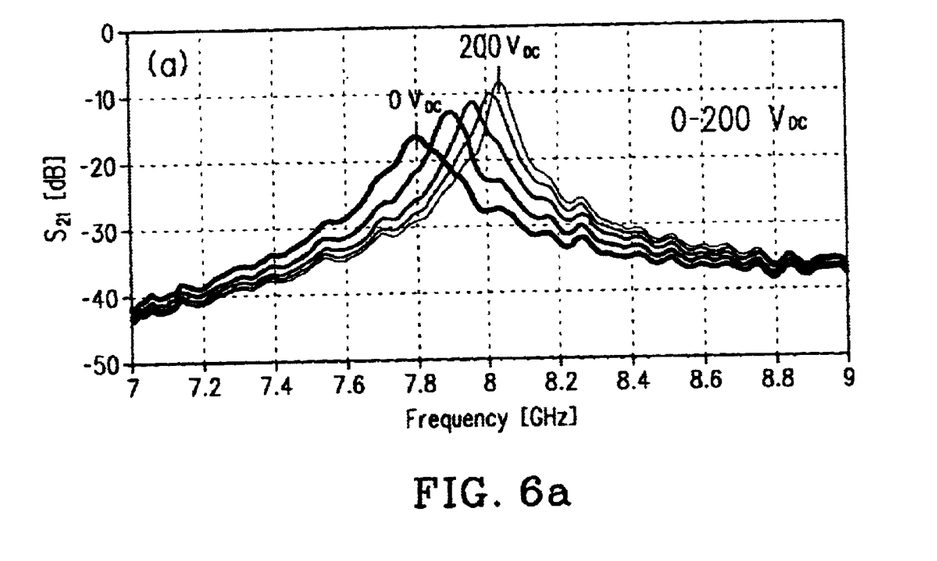
FIGS. 6a and 6b are resonance curves of a stripline resonator incorporating planar varactors of BST films grown (a) without and (b) with a BST buffer layer at different applied DC bias voltages up to 200 V at room temperature.
Figure 6B:
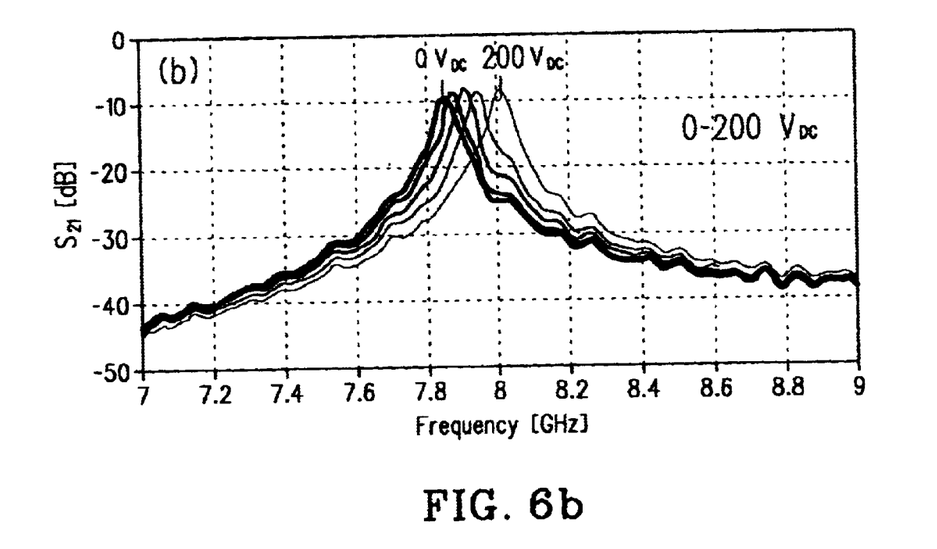

FIG. 6a is resonance curve of a stripline resonator incorporating a planar varactor as illustrated in FIG. 5a based on a strained but defect-reduced epitaxial BST (x=0.4) film deposited directly on (001) MgO without a BST (x=0.4) buffer layer and then annealed in flowing $O_2$ at 1,000° C. for 6 hours. FIG. 6b is a resonance curve of a stripline resonator incorporating a planar varactor as illustrated in FIG. 5b based on a strain-relieved and defect-reduced randomly oriented crystalline BST (x=0.4) film deposited on (001) MgO with a BST (x=0.4) buffer layer, and then annealed in flowing $O_2$ at 1,000° C. for 6 hours according to the present invention. The resonance curves were measured at about 8 GHz and room temperature as a function of DC bias voltage to the varactor. The 8 GHz dielectric properties (i.e., dielectric Q and dielectric tuning) of the films were extracted from the resonance responses of FIGS. 6a and 6b, respectively, and are presented in Table 2. Table 2 is a table of 8 GHz dielectric properties of planar varactors of FIGS. 5a and 5b.

TABLE 2

| BST Varactor | Cp | $\epsilon_{film}$ | $V_{DC}$ (V) | Gap (μm) | Q (0 $V_{DC}$) | Q (200 $V_{DC}$) | % T (Cp) |
|---|---|---|---|---|---|---|---|
| FIG. 5a | 0.443 | 526 | 0–200 | 18 | 21 | 142 | 28 |
| FIG. 5b | 0.435 | 371 | 0–200 | 18 | 146 | 152 | 16 |

Table 2 shows a significant difference in dielectric Q values in terms of magnitude and DC bias voltage dependency between the BST film without the BST buffer layer of FIG. 5a and the BST film with the BST buffer layer of FIG. 5b. The BST film with the BST buffer layer according the present invention shows more stable DC bias voltage dependency over the bias range (i.e., 0 to 200 $V_{DC}$) and higher dielectric Q at 0 $V_{DC}$ than the typical prior art BST film.

Figure 7A:
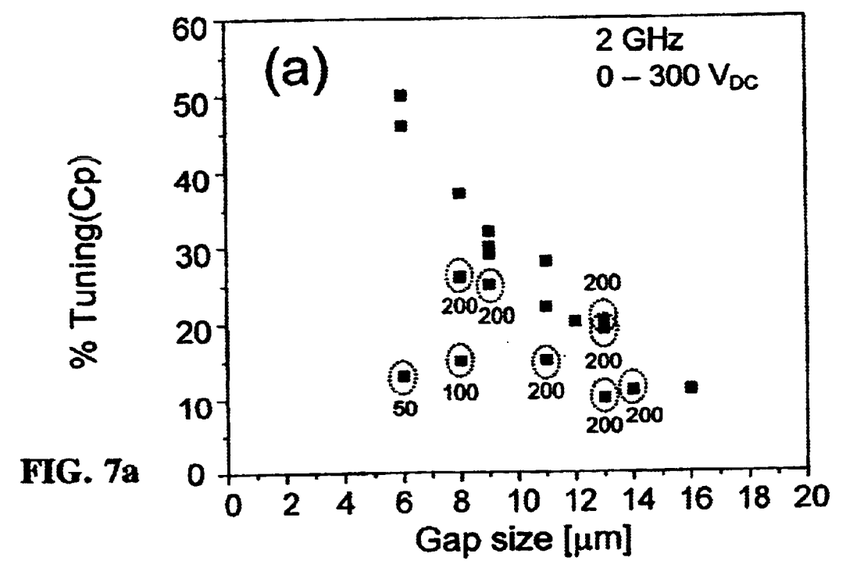
FIGS. 7a and 7b are plots of (a) percentage tuning of capacitance and (b) Q of varactor as a function of varactor gap size at 2 GHz and at DC bias voltages up to 300 V.
Figure 7B:
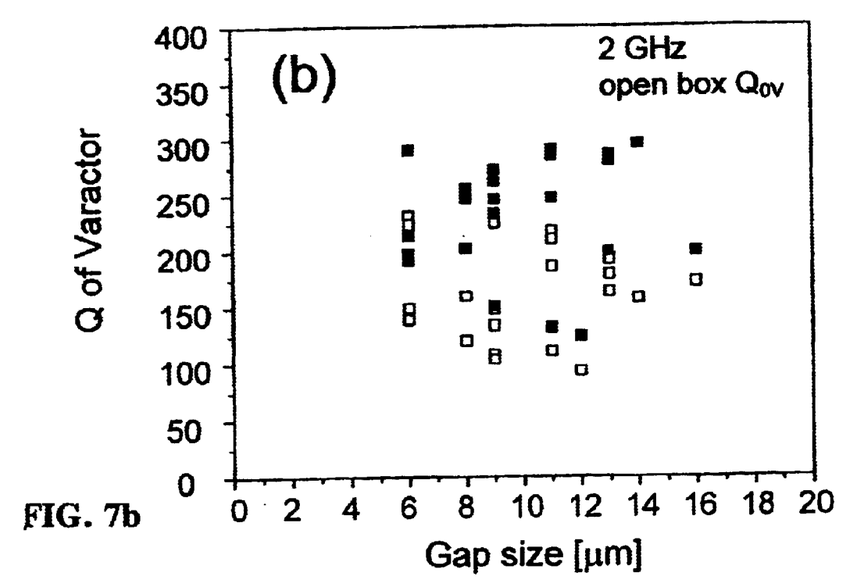

More characterizations of small signal microwave properties of planar varactor containing strain-relieved and defect-reduced BST (x=0.4) thin film with BST (x=0.4) buffer layer according to the present invention were made as a function of varactor gap size ranging from 6 to 18 μm. FIGS. 7a and 7b are plots of dielectric tuning and dielectric Q of varactor as a function of varactor gap size at 2 GHz and at DC bias voltages up to 300 V except the circled data points with $V_{MAX}$=50–200 $V_{DC}$ as noted close to the circles for planar varactors based on BST film with BST buffer layer according to the present invention. Several different varactors with a same gap size are characterized for certain gap sizes, and the open-box data points in FIG. 7a indicates dielectric Q of varactor at 0 $V_{DC}$.

Figure 8A:
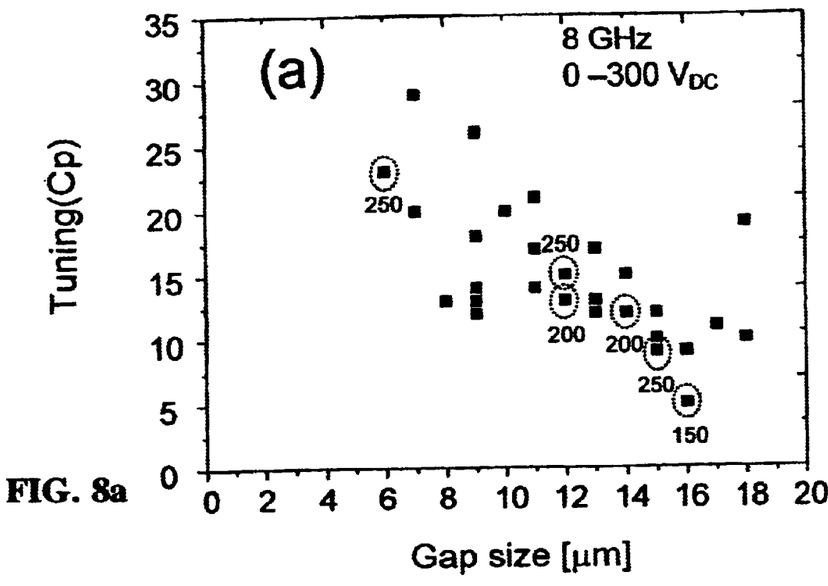
FIGS. 8a and 8b are plots of (a) percentage tuning of capacitance and (b) Q of varactor as a function of varactor gap size at 8 GHz and at DC bias voltages up to 300 V.
Figure 8B:
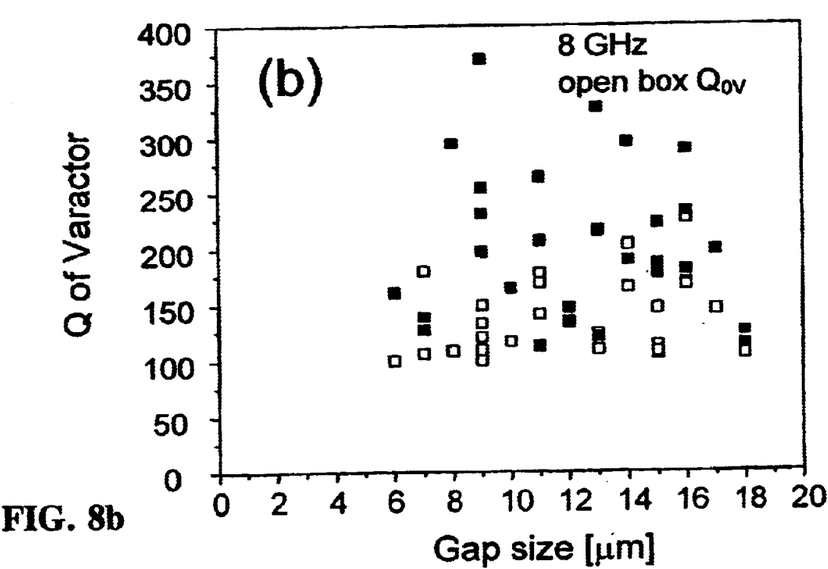

FIGS. 8a and 8b are plots of dielectric tuning and dielectric Q of varactors as a function of varactor gap size at 8 GHz and at DC bias voltages up to 300 V, except the circled data points with $V_{MAX}$=150–200 $V_{DC}$ as noted close to the circles for planar varactors based on the BST film with BST buffer layer according to the present invention. Several different varactors with a same gap size are characterized for different gap sizes, and the open-box data points in FIG. 8b indicate dielectric Q of varactor at 0 $V_{DC}$. At both frequencies (2 GHz and 8 GHz), the dielectric tuning tends to increase as the gap size decreases as shown in FIG. 7a and FIG. 8a. However, in case of the dielectric Q, no clear trend with the gap sizes is observed. High dielectric Q's are achieved independently of the gap sizes when the gaps ranged from 6 to 18 μm.

Whereas particular embodiments of this invention have been described above for purposes of illustration, it will be evident to those skilled in the art that numerous variations of the details of the present invention may be made without departing from the invention as defined in the appended claims.

What is claimed is:
1. A tunable dielectric thin film comprising:
   a low dielectric loss substrate;
   a buffer layer on the low dielectric loss substrate; and
   a crystalline dielectric film on the buffer layer, wherein the buffer layer and the crystalline dielectric film comprise barium strontium titanate and wherein the barium strontium titanate comprises a randomly oriented crystalline cubic phase in each of the buffer layer and the crystalline dielectric film.

2. The tunable dielectric thin film of claim 1, wherein the barium strontium titanate is of the formula $Ba_{1-x}Sr_xTiO_3$, where x is from about 0.0 to about 0.6.

3. The tunable dielectric thin film of claim 2, wherein x is about 0.4.

4. The tunable dielectric thin film of claim 1, wherein the buffer layer has a thickness of from about 0.0005 to about 0.2 micron.

5. The tunable dielectric thin film of claim 1, wherein the buffer layer has a thickness of from about 0.01 to about 0.1 micron.

6. The tunable dielectric thin film of claim 1, wherein the buffer layer is vapor deposited.

7. The tunable dielectric thin film of claim 1, wherein the buffer layer is porous.

8. The tunable dielectric thin film of claim 1, wherein the buffer layer is annealed.

9. The tunable dielectric thin film of claim 1, wherein the crystalline dielectric film has a thickness of from about 0.1 to about 5 micron.

10. The tunable dielectric thin film of claim 1, wherein the crystalline dielectric film has a thickness of from about 0.3 to about 1 micron.

11. The tunable dielectric thin film of claim 1, wherein the crystalline dielectric film is vapor deposited.

12. The tunable dielectric thin film of claim 1, wherein the crystalline dielectric film is annealed.

13. The tunable dielectric thin film of claim 1, wherein the barium strontium titanate of the buffer layer is deposited at a lower temperature than the barium strontium titanate of the crystalline dielectric film.

14. The tunable dielectric thin film of claim 1, wherein the crystalline dielectric film is strain relieved.

15. The tunable dielectric thin film of claim 1, wherein the crystalline dielectric film is substantially strain free.

16. The tunable dielectric thin film of claim 1, wherein the low dielectric loss substrate comprises at least one crystalline material selected from magnesium oxide, aluminum oxide and lanthanum aluminum oxide.

17. The tunable dielectric thin film of claim 1, wherein the low dielectric loss substrate has a thickness of from about 250 to about 500 micron.

18. The tunable dielectric thin film of claim 1, wherein the dielectric thin film has a dielectric quality factor Q at 0 $V_{DC}$ of greater than about 100 at a frequency of 2 GHz or 8 GHz.

19. The tunable dielectric thin film of claim 1, wherein the dielectric thin film has a dielectric tuning of at least about 20 percent at 50 V/micron at a frequency of 2 GHz or 8 GHz.

20. The tunable dielectric thin film of claim 1, wherein the tunable dielectric thin film is used within a tunable microwave device.

21. A tunable microwave device comprising:
a low dielectric loss substrate;
a buffer layer on the low dielectric loss substrate;
a crystalline dielectric film on the buffer layer, wherein the buffer layer and the crystalline dielectric film comprise barium strontium titanate and wherein the barium strontium titanate comprises a randomly oriented crystalline cubic phase in each of the buffer layer and the crystalline dielectric film; and
a pair of electrodes on the crystalline dielectric film, wherein the pair of electrodes are separated from one another by a predetermined gap.

22. The tunable microwave device of claim 21, wherein the barium strontium titanate is of the formula $Ba_{1-x}Sr_xTiO_3$, where x is from about 0.0 to about 0.6.

23. The tunable microwave device of claim 22, wherein x is about 0.4.

24. The tunable microwave device of claim 21, wherein the buffer layer has a thickness of from about 0.0005 to about 0.2 micron.

25. The tunable microwave device of claim 21, wherein the buffer layer and the crystalline dielectric film are vapor deposited.

26. The tunable microwave device of claim 21, wherein the buffer layer and the crystalline dielectric film are annealed.

27. The tunable microwave device of claim 21, wherein the crystalline dielectric film has a thickness of from about 0.1 to about 5 micron.

28. The tunable microwave device of claim 21, wherein the barium strontium titanate of the buffer layer is deposited at a lower temperature than the barium strontium titanate of the crystalline dielectric film.

29. The tunable microwave device of claim 21, wherein the low dielectric loss substrate comprises at least one crystalline material selected from magnesium oxide, aluminum oxide and lanthanum aluminum oxide.

30. The tunable microwave device of claim 21, wherein the low dielectric loss substrate has a thickness of from about 250 to about 500 micron.

31. The tunable microwave device of claim 21, therein the dielectric thin film has a dielectric quality factor Q at 0 $V_{DC}$ of greater than about 100 at a frequency of 2 GHz or 8 GHz.

32. The tunable microwave device of claim 21, wherein the dielectric thin film has a dielectric tuning of at least about 20 percent at 50 V/micron at a frequency of 2 GHz or 8 GHz.

33. The tunable microwave device of claim 21, wherein the tunable microwave device is a varactor capable of operating at or above 2 GHz.

34. A tunable dielectric thin film comprising:
a low dielectric loss substrate;
a buffer layer deposited on the low dielectric loss substrate in an oxygen background pressure of about 200 mTorr; and
a crystalline dielectric film deposited on the buffer layer and then annealed in flowing oxygen at about 1000° C. for about 6 hours, wherein the buffer layer and the crystalline dielectric film comprise barium strontium titanate and wherein the barium strontium titanate comprises a randomly oriented crystalline cubic phase in each of the buffer layer and the crystalline dielectric film.

35. The tunable dielectric thin film of claim 34, wherein the barium strontium titanate is of the formula $Ba_{1-x}Sr_xTiO_3$, where x is from about 0.0 to about 0.6.

36. The tunable dielectric thin film of claim 35, wherein x is about 0.4.

37. The tunable dielectric thin film of claim 34, wherein the barium strontium titanate of the buffer layer is deposited at a lower temperature than the barium strontium titanate of the crystalline dielectric film.

38. The tunable dielectric thin film of claim 34, wherein the dielectric thin film has a dielectric quality factor Q at 0 $V_{DC}$ of greater than about 100 at a frequency of 2 GHz or 8 GHz.

39. The tunable dielectric thin film of claim 34, wherein the dielectric thin film has a dielectric tuning of at least about 20 percent at 50 V/micron at a frequency of 2 GHz or 8 GHz.

40. The tunable dielectric thin film of claim 35, wherein the tunable dielectric thin film is used within a tunable microwave device.

* * * * *